United States Patent [19]
Valdman

[11] 3,953,254
[45] Apr. 27, 1976

[54] METHOD OF PRODUCING TEMPERATURE COMPENSATED REFERENCE DIODES UTILIZING SELECTIVE EPITAXIAL GROWTH

[75] Inventor: Henri Valdman, Paris, France

[73] Assignee: Thomson-CSF, Paris, France

[22] Filed: Mar. 25, 1975

[21] Appl. No.: 561,800

Related U.S. Application Data

[63] Continuation of Ser. No. 413,384, Nov. 6, 1973, abandoned.

[30] Foreign Application Priority Data

Nov. 7, 1972  France .............................. 72.39350

[52] U.S. Cl. .................................. 148/175; 29/573; 29/574; 29/575; 148/191; 357/13; 357/28; 357/37; 357/38; 357/76
[51] Int. Cl.² .................. H01L 21/20; H01L 23/56; H01L 29/90
[58] Field of Search ............. 148/175, 191; 357/13, 357/37, 38, 76, 28; 29/573, 574, 575

[56] References Cited
UNITED STATES PATENTS

| | | | |
|---|---|---|---|
| 3,231,796 | 1/1966 | Shombert | 357/13 X |
| 3,260,900 | 7/1966 | Shombert | 357/28 |
| 3,274,400 | 9/1966 | Weinstein | 357/28 X |
| 3,278,814 | 10/1966 | Rutz | 357/13 X |
| 3,375,417 | 3/1968 | Hull et al. | 357/13 X |
| 3,400,306 | 9/1968 | Knauss | 357/13 X |
| 3,410,735 | 11/1968 | Hackley | 148/175 X |
| 3,421,055 | 1/1969 | Bean et al. | 148/175 X |
| 3,519,900 | 7/1970 | Lawrence | 29/573 X |

*Primary Examiner*—L. Dewayne Rutledge
*Assistant Examiner*—W. G. Saba
*Attorney, Agent, or Firm*—Cushman, Darby & Cushman

[57] ABSTRACT

Method of manufacturing temperature compensated zener-type semiconductor devices, made of a zener diode and two forward-biased diodes arranged in series, the three diodes being formed in a single monolithic unit on the two faces of a flat substrate, by an epitaxial technique.

3 Claims, 4 Drawing Figures

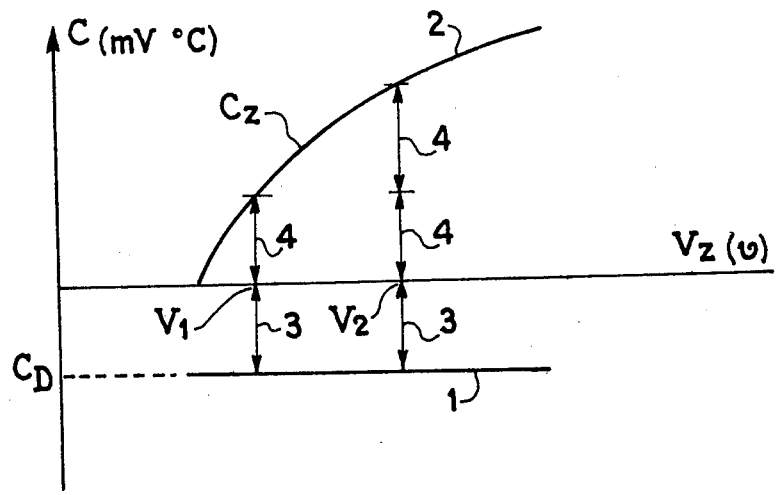
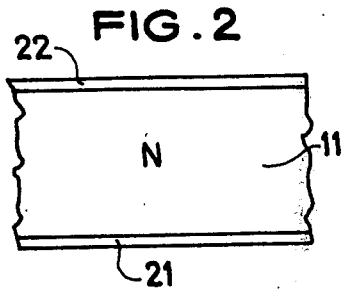
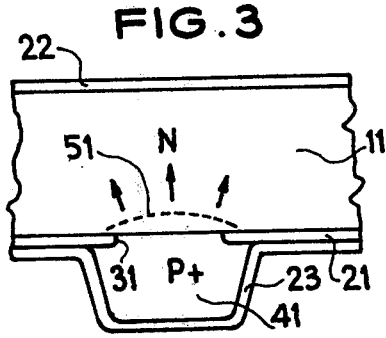
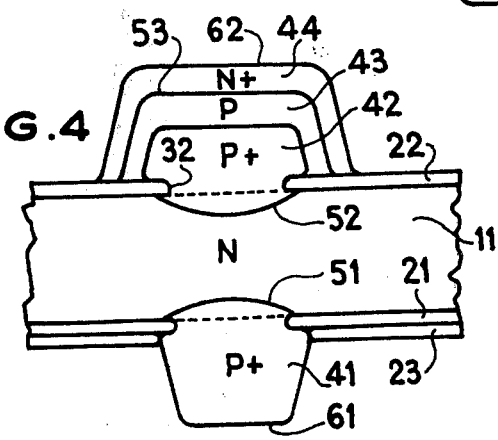

METHOD OF PRODUCING TEMPERATURE COMPENSATED REFERENCE DIODES UTILIZING SELECTIVE EPITAXIAL GROWTH

This is a continuation of application Ser. No. 413,384 filed Nov. 6, 1973, now abandoned.

The present invention relates to diodes of the kind generally known as zener diodes which, when a reverse bias voltage is applied to them, exhibit a voltage-current characteristic with a horizontal step followed by a sharp knee, which makes them advantageous in a wide variety of applications where a constant voltage is required.

However, these diodes, whose operation at voltages ranging between 3 and 8 volts is in fact due to two simultaneous physical effects, namely the zener effect and the avalanche effect (although, in the whole of the ensuing description, the term zener will be used alone, in order to simplify matters), exhibit a certain sensitivity to temperature variations which undesirably influence the value of the voltage which they stabilise.

Having a mean value of the order of 1 mV/°C, this voltage variation, or temperature coefficient, which is always positive at zener voltages in excess of around 5 volts, is not constant in reality, and increases with the operating zener voltage.

By contrast, it is well known that forward-biased diodes have a temperature coefficient which is always negative and has a mean value in the order of − 1 mV/°C. It would therefore appear possible, by the series arrangement of a zener diode and a forward-biased diode, to eradicate the unwanted influence of temperature variations upon the value of the zener voltage.

Thus, reference voltage diodes have been created by the series connection of lumped components produced by the stacking of several semiconductor elements in a single casing; but that leads to considerable disadvantages, such as high electrical and thermal resistance and poor production efficiency. Subsequently, reference diodes were produced in a single semiconductor crystal, the two diodes being manufactured either both by an alloy operation, or one by alloying, namely the zener diode, and the other by an epitaxial operation.

However, these devices involved delicate manufacturing operations and were limited to the production of a double diode. In fact, in order to be able to exploit reference devices designed according to this compensating principle, within higher voltage ranges, it is necessary to connect in series with the zener diode, two forward-biased diodes; it is also necessary to be able to accurately adjust during manufacture, the voltage across each of the junctions and thus to achieve exact compensation for any desired operating voltage.

The object of the present invention is a method of manufacturing zener diodes which exhibit these advantages, there being embodied within the same block of semiconductor material, a reverse-biased zener diode and two forward-biased diodes.

The invention relates to a method of manufacturing a thermally compensated reference diode, comprising the following steps:
 — the formation upon one face of a monocrystalline semiconductor substrate, of a relief "button" of monocrystalline semiconductor material, having the opposite conductivity type to that of the substrate;
 — the formation, upon that surface of the semiconductor substrate which is opposite to that of the button, of a second relief button of monocrystalline semiconductor material, having the opposite conductivity type to that of the substrate;
 — the formation on the second button of a monocrystalline semiconductor film having the same conductivity type as the substrate.

FIG. 1 illustrates an explanatory diagram showing the variations in the respective temperature coefficients of reverse-biased and forward-biased diodes, and taking account of the compensating mechanism provided by two diodes.

FIGS. 2, 3 and 4 illustrate the chief steps in the process of manufacture of the reference diodes in accordance with the invention.

In a graph, on the abscissae of which the operating voltages $V_z$ are plotted and on whose ordinates the temperature coefficients C, there have been shown on the one hand the curve (marked 1) relating to a forward-biased diode, this being a straight line parallel to the horizontal, since, as mentioned earlier, the temperature coefficient of this kind of diode is substantially constant and equal to $C_D$, and on the other hand the curve (marked 2) showing the variation for a reverse-biased zener diode.

It will be seen that by the series connection of a forward-biased diode and a reverse-biased diode, precise thermal compensation is achieved for an operating voltage $V_1$ determined by the condition of equality of the segments 3 and 4 of opposite sign; it will be seen, furthermore, that by the connection of two diodes in a forward-biased arrangement and of one diode in a reverse-biased arrangement, a device is obtained which is temperature-compensated within a new operating range $V_2$, determined by the condition of equality between two segments (3+3) and (4+4).

On the other hand, the ordinate value $C_D$ does not have a determinate physical magnitude, and by suitable manufacturing processes, it is possible to make this vary around its mean value and consequently to readily obtain exact thermal compensation for a given operating voltage $V_2$.

Several devices are formed simultaneously on the same semiconductor wafer, but to simplify matters, we will confine ourselves to a description of one device only.

FIG. 2 illustrates an N-type silicon substrate 11 of wafer form, whose resistivity is determined by the voltage across the junction of the reverse-biased diodes; on each face of the wafer, there is deposited a film 21 and 22 of insulating material providing protection against contamination, i.e. a film such as silica.

In FIG. 3, it can be seen that there is subsequently formed in the film 21 a square opening 31 of approximately 300 μm side length, this by conventional photo etching techniques, whereafter, by localized expitaxy, a silicon button 41 of P+ type, having a thickness of around 50 μm, is deposited in relief form upon the substrate 11, occupying the opening 31. The button 41 is for example formed by means of the iodine epitaxial process, a working example of which will be quoted hereinafter:

In a reaction vessel, the substrate wafer is arranged opposite a source wafer of P+ type, boron-doped and having a resistivity in the order of $10^{-3}$ Ω cm. The substrate wafer is raised to a temperature of around 1100° C and the source to a temperature of around 950° C. The iodine vapour is introduced at a pressure of 1 mm of mercury. The silicon of the source wafer combines with the iodine and the compound formed then decomposes on contact with the exposed parts of the substrate wafer, leaving silicon behind there. The speed of growth of the button 41 is of the order of 3 to 5 μm per minute, its resistivity being exactly that of the source. After formation of the button 41, the wafer is subjected to an oxidizing heat treatment bringing about the diffusion of P+ impurities into the substrate 11 where the PN junction 51 is formed, and bringing about the formation of a silica film 23 on the button 41.

Referring now to FIG. 4, a fresh step of the process can be seen, in accordance with which on the opposite face of the wafer to that carrying the button 41, an opening 32 is formed in the silica film 22, having the same dimensions as and located exactly opposite, the opening 31. Within the opening 32, a silicon button 42 of P+ type is made to grow, which has a resistivity of the order of $10^{-3}$ Ω cm, and a thickness of 15 to 20 μm, the epitaxial method already described being used for this purpose. By modifying the resistivity of the source, the button 42 becomes covered with a film 43 of the same conductivity type, albeit more weakly doped, having a thickness of 15 to 20 μm. Then, the film 43 is covered with a film of silicon 44 of N+ type, having a thickness of 15 to 20 μm deposited by localized epitaxy after changing the source.

The final step of the process involves the precise adjustment of the aforementioned compensating conditions. To do this, the wafer is subjected to a heat treatment involving the diffusion of P type impurities from the button 42 into the substrate 11, where a PN junction 52 is formed, the time taken by the heat treatment being extended until the desired voltage across the terminals of the device is reached. The voltage across the terminals of the device is measured on the wafer, giving the face 62 negative polarity, the face 61 being of positive polarity. Thus, the PN junctions 53 and 51 are forward-biased and the junction 52 is avalanche operated, the resistivities of the zones 41, 42, 43, 44 having been chosen in typical cases in order, for the forward-biased junctions 51 and 53 to achieve voltages of around 0.7 V, and for the reverse-biased junction 52, a voltage of around 7.1 V.

After adjustment of the voltage across the terminals of the device, temperature compensation is checked on the wafer. If compensation is insufficient, it is then possible to modify the temperature coefficient of the forward-biased junction 51 by carrying out from the face 61, gold doping of the diode formed by the zones 41 and 11, this using any conventional technique.

After metallizing the faces 61 and 62 which are intended to provide electrical contact with the external leads (not shown in the figures), the wafer is cut into separate elements ready for encapsulation.

The present invention is not limited to the method described hereinbefore. Modification can be made to it from the point of view of conductivity type and the resistivities of the various zones which form the devices, as well as from the point of view of the geometric characteristics.

What is claimed is:

1. A method of manufacturing a thermally compensated reference diode, comprising the following steps:
— the formation upon one face of a monocrystalline semiconductor substrate, of a relief button of monocrystalline semiconductor material, by selectively growing an epitaxial region of the opposite conductivity type to that of the substrate;
— the formation, upon that surface of the semiconductor substrate which is opposite to that of the first button, of a second relief button of monocrystalline semiconductor material, by selectively growing an epitaxial region of the opposite conductivity type to that of the substate;
— the formation on the second button of a monocrystalline semiconductor film having the same conductivity type as the substate by epitaxial growth.

2. A method as claimed in claim 1, comprising, between the second and third stages, an intermediate stage in which, on the second button, there is formed a monocrystalline semiconductor film of the same conductivity type as said button but of higher resistivity.

3. A method as claimed in claim 1, moreover comprising after the last step, a heat treatment which, by diffusion at the junctions, produces adjustment of the operating voltage and of said thermal compensation.

* * * * *